(12) United States Patent
Coe-Sullivan et al.

(10) Patent No.: US 10,225,906 B2
(45) Date of Patent: Mar. 5, 2019

(54) LIGHT EMITTING DEVICE INCLUDING SEMICONDUCTOR NANOCRYSTALS

(75) Inventors: Seth Coe-Sullivan, Belmont, MA (US); Jonathan S. Steckel, Cambridge, MA (US); LeeAnn Kim, Dover, MA (US); Moungi G. Bawendi, Cambridge, MA (US); Vladimir Bulovic, Lexington, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 287 days.

(21) Appl. No.: 11/253,595

(22) Filed: Oct. 20, 2005

(65) Prior Publication Data

US 2008/0001167 A1 Jan. 3, 2008

Related U.S. Application Data

(60) Provisional application No. 60/620,967, filed on Oct. 22, 2004, provisional application No. 60/629,579, filed on Nov. 22, 2004.

(51) Int. Cl.
*H05B 33/10* (2006.01)
*B41M 5/025* (2006.01)
(Continued)

(52) U.S. Cl.
CPC ............ *H05B 33/10* (2013.01); *B41J 2/0057* (2013.01); *B41M 3/003* (2013.01); *B41M 5/0256* (2013.01); *B82Y 20/00* (2013.01); *B82Y 30/00* (2013.01); *H01L 21/6715* (2013.01); *H05B 33/145* (2013.01); *B41M 1/02* (2013.01); *H01L 51/502* (2013.01); *H01L 51/5012* (2013.01); *H01L 51/56* (2013.01)

(58) Field of Classification Search
CPC ...... H05B 33/10; H05B 33/145; B41J 2/0057; B41M 3/003; B41M 5/0256; B41M 1/02; B82Y 20/00; B82Y 30/00; H01L 21/6715; H01L 51/5012; H01L 51/56
USPC .................................................. 313/498–512
See application file for complete search history.

(56) References Cited

U.S. PATENT DOCUMENTS 3,998,573 A * 12/1976 Gilbert .................. F16D 65/062
425/117
4,957,808 A * 9/1990 Arai et al. .................... 442/149
(Continued)

FOREIGN PATENT DOCUMENTS

EP 0954205 11/1999
EP 1065725 1/2001
(Continued)

OTHER PUBLICATIONS

Coe, S et al., "Electroluminescence from single monolayers of nanocrystals in molecular organic devices," Nature, Nature Publishing Group, vol. 420, No. 6917, Dec. 19, 2002, pp. 800-803.
(Continued)

*Primary Examiner* — Anh Mai
*Assistant Examiner* — Fatima Farokhrooz
(74) *Attorney, Agent, or Firm* — Steptoe & Johnson LLP

(57) ABSTRACT

A light emitting device includes a semiconductor nanocrystal in a layer. The layer can be a monolayer of semiconductor nanocrystals. The monolayer can form a pattern on a substrate.

21 Claims, 11 Drawing Sheets

(51) Int. Cl.

| | | |
|---|---|---|
| B82Y 20/00 | (2011.01) | |
| B82Y 30/00 | (2011.01) | |
| H01L 21/67 | (2006.01) | |
| B41J 2/005 | (2006.01) | |
| B41M 3/00 | (2006.01) | |
| H05B 33/14 | (2006.01) | |
| H01L 51/50 | (2006.01) | |
| H01L 51/56 | (2006.01) | |
| B41M 1/02 | (2006.01) | |

(56) References Cited

U.S. PATENT DOCUMENTS

| | | | |
|---|---|---|---|
| 5,099,256 A * | 3/1992 | Anderson | B41J 2/0057 346/25 |
| 5,260,957 A | 11/1993 | Hakimi et al. | |
| 5,293,050 A | 3/1994 | Chapple-Sokol et al. | |
| 5,354,707 A | 10/1994 | Chapple-Sokol et al. | |
| 5,422,489 A | 6/1995 | Bhargava | |
| 5,505,928 A | 4/1996 | Alivisatos et al. | |
| 5,512,131 A | 4/1996 | Kumar et al. | |
| 5,525,377 A | 6/1996 | Gallagher et al. | |
| 5,537,000 A | 7/1996 | Alivisatos et al. | |
| 5,585,640 A | 12/1996 | Huston et al. | |
| 5,613,140 A | 3/1997 | Taira | |
| 5,677,545 A | 10/1997 | Shi et al. | |
| 5,751,018 A | 5/1998 | Alivisatos et al. | |
| 5,755,883 A * | 5/1998 | Kinose et al. | 118/110 |
| 5,816,158 A * | 10/1998 | Ross | B41F 1/40 101/324 |
| 5,853,446 A * | 12/1998 | Carre et al. | 65/17.3 |
| 5,900,160 A | 5/1999 | Whitesides et al. | |
| 5,958,573 A | 9/1999 | Spitler et al. | |
| 6,103,868 A | 8/2000 | Heath et al. | |
| 6,157,047 A | 12/2000 | Fujita et al. | |
| 6,163,038 A | 12/2000 | Chen et al. | |
| 6,180,239 B1 | 1/2001 | Whitesides et al. | |
| 6,207,229 B1 | 3/2001 | Bawendi et al. | |
| 6,236,060 B1 | 5/2001 | Chan et al. | |
| 6,251,303 B1 | 6/2001 | Bawendi et al. | |
| 6,294,401 B1 | 9/2001 | Jacobson et al. | |
| 6,322,901 B1 | 11/2001 | Bawendi et al. | |
| 6,348,295 B1 | 2/2002 | Griffith et al. | |
| 6,379,635 B2 | 4/2002 | O'Brien et al. | |
| 6,447,698 B1 | 9/2002 | Ihara et al. | |
| 6,494,570 B1 * | 12/2002 | Snyder | 347/103 |
| 6,501,091 B1 | 12/2002 | Bawendi et al. | |
| 6,518,168 B1 | 2/2003 | Clem et al. | |
| 6,576,291 B2 | 6/2003 | Bawendi et al. | |
| 6,601,944 B1 * | 8/2003 | Kawazoe | 347/37 |
| 6,607,829 B1 | 8/2003 | Bawendi et al. | |
| 6,797,412 B1 | 9/2004 | Jain et al. | |
| 6,803,719 B1 | 10/2004 | Miller et al. | |
| 6,846,565 B2 | 1/2005 | Korgel et al. | |
| 6,864,626 B1 * | 3/2005 | Weiss et al. | 313/503 |
| 6,887,332 B1 * | 5/2005 | Kagan et al. | 427/97.3 |
| 2001/0005495 A1 | 6/2001 | O'Brien et al. | |
| 2002/0090565 A1 * | 7/2002 | Griffith et al. | 430/198 |
| 2003/0017264 A1 * | 1/2003 | Treadway | C09K 11/08 427/212 |
| 2003/0042850 A1 | 3/2003 | Bertram et al. | |
| 2003/0138733 A1 * | 7/2003 | Sachdev | C08F 290/048 430/311 |
| 2003/0152703 A1 * | 8/2003 | Hammond et al. | 427/256 |
| 2003/0186914 A1 | 10/2003 | Hofer et al. | |
| 2003/0230970 A1 * | 12/2003 | Steckl et al. | 313/498 |
| 2004/0023010 A1 * | 2/2004 | Bulovic et al. | 428/209 |
| 2004/0035605 A1 * | 2/2004 | Griffith et al. | 174/257 |
| 2004/0086709 A1 * | 5/2004 | Hammond Cunningham et al. | 428/335 |
| 2004/0160154 A1 | 8/2004 | Nishimura et al. | |
| 2004/0163758 A1 * | 8/2004 | Kagan et al. | 156/230 |
| 2004/0217298 A1 * | 11/2004 | Bawendi | B82Y 15/00 250/458.1 |
| 2004/0265622 A1 | 12/2004 | Sadasivan et al. | |
| 2005/0009224 A1 * | 1/2005 | Yang et al. | 438/57 |
| 2005/0117868 A1 * | 6/2005 | Chen et al. | 385/143 |
| 2005/0118338 A1 * | 6/2005 | Stebe et al. | 427/331 |
| 2005/0258418 A1 | 11/2005 | Steckel et al. | |
| 2005/0263025 A1 | 12/2005 | Blees | |
| 2006/0159901 A1 | 7/2006 | Tischler et al. | |
| 2006/0196375 A1 | 9/2006 | Coe-Sullivan et al. | |

FOREIGN PATENT DOCUMENTS

| | | |
|---|---|---|
| EP | 1 424 732 | 6/2004 |
| JP | A-H05-116475 | 5/1993 |
| JP | A-H11-340516 | 12/1999 |
| JP | 2002192540 * | 7/2002 |
| JP | A-2003-39399 | 2/2003 |
| JP | 02004030926 A * | 1/2004 |
| JP | A-2004-71357 | 3/2004 |
| JP | 2004030926 * | 1/2010 |
| WO | WO 96/10282 | 4/1996 |
| WO | WO 97/10175 | 3/1997 |
| WO | WO 99/26299 | 5/1999 |
| WO | WO 00/06392 | 2/2000 |
| WO | WO 00/20916 | 4/2000 |
| WO | WO 02/091803 | 11/2002 |
| WO | WO 2003/084292 | 10/2003 |
| WO | WO 2004/013697 | 2/2004 |
| WO | WO 2005004253 | 1/2005 |
| WO | WO 2005017951 | 2/2005 |
| WO | WO 2006/047215 | 5/2006 |
| WO | WO 2006/088877 | 8/2006 |

OTHER PUBLICATIONS

Coe-Sullivan, S. et al., "Large-area ordered quantum-dot monolayers via phase separation during spin-casting," Advanced Functional Materials Wiley-Vch Germany, vol. 15, No. 7, Jul. 2005, pp. 1117-1124.

Coe-Sullivan, S. et al., "Method for fabrication of saturated RGB quantum dot light emitting devices," Progress in Biomedical Optics and Imaging—Proceedings of Spie; Light-Emitting Diodes: Research, Manufacturing, and Applications IX 2005, vol. 5739, 2005, pp. 108-115.

Gao, Mingyuan et al., "Lateral patterning of CdTe nanocrystal films by the electric field directed layer-by-layer assembly method," Langmuir, May 14, 2002, vol. 18, No. 10 pp. 4098-4102.

Wu, Xiao C et al,, "Microcontact Printing of CDS/Dendrimer Nanocomposite Patterns on Silicon Wagers," Advanced Materials Mar. 5, 2004, vol. 16, No. 5, pp. 413-417.

Adachi et al., "High-efficiency red electrophosphorescence devices", Appl. Phys. Lett. 78, 1622 (2001).

Aktsipetrov et al. "Generation of reflected second harmonic at semiconductor quantum dots," JETP Letters, vol. 55, No. 8, 435-439 (1992).

Alivisatos, "Perspectives on the Physical Chemistry of Semiconductor Nanocrystals" J. Phys. Chem. 1996(100):13226-13239, 1996.

Baltramiejunas et al., "Rapid Processes of Darkening and Bleaching in CdS Doped Glasses," Superlattices and Microstructures vol. 10, No. 3, 307-310 (1990).

Baltrameyunas et al., "Fast switching of the transmission of light by glasses activated with CdS microcrystals," Sov. Phys. Semicond., vol. 25 No. 2, 164-166 (1991).

Bhargava et al., "Quantum Confined Atoms of Doped ZnO Nanocrystals", Phys. Stat. Sol (b) 229, No. 2, 897-901 (2002).

Bulovic et al., "Molecular Organic Light-Emitting Devices", Semiconductors and Semimetals 64, 255 (2000).

Chamarro et al., "Enhancement of Exciton Exchange Interaction by Quantum Confinement in CdSe Nanocrystals," Jpn. J. Appl. Phys, vol. 34, 12-14 (1994).

Chamarro et al., "Size-dependent Electron-Hole Exchange Interaction in CdSe Quantum Dots, Il Nuovo Cimento," vol. 17, Nos. 11-12, (1995) 1407-1412.

Chamarro et al., "Enhancement of electron-hole exchange interaction in CdSe nanocrystals; A quantum confinement effect," Physical Review B, vol. 53, No. 3, Jan. 15, 1996—I, 1336-1342.

(56) References Cited

OTHER PUBLICATIONS

Chepic et al., "Auger ionization of semiconductor quantum drops in a glass matrix," Journal of Luminescence 47 (1990) 113-127 North-Holland.
Colvin et al., "Light-emitting diodes made from cadmium selenide nanocrystals and a semiconducting polymer" Nature 370(6488):354-357, Aug. 4, 1994.
D'Andrade et al., "Bright White Electrophosphorescent Triple-Emissive Layer Organic Light Emitting Device", MRS Fall Meeting, BB6.2 (2001).
Dabbousi et al., "Electroluminescence from CdSe quantum-dot/polymer composites" Appl. Phys. Lett. 66(11):1316-1318, Mar. 13, 1995.
Dabbousi et al., "(CdSe)ZnS Core-Shell Quantum Dots: Synthesis and Characterization of a Size Series of Highly Luminescent Nanocrystallites", J. Phys. Chem. B. 101, 9463 (1997).
Danek et al., "Synthesis of Luminescent Thin-Film CdSe/ZnSe Quantum Dot Composites Using CdSe Quantum Dots Passivated with an Overlayer of ZnSe" Chem. Mater. 8(1):173-180, 1996.
Diehl, "Fraunhofer LUCOLEDs to replace lamps," III-Vs Rev. 10(1), 1997.
Dirr et al., "Organic Light Emitting Diodes with Reduced Spectral and Spacial Halfwidths", Jpn. J. Appl. Phys. 37, 1457 (1998).
Dneproviskii et al., "Time-Resolved Luminescence of CdSe Microcrystals," Solid State Communications, vol. 74, No. 7, pp. 555-557 (1990).
Edamatsu et al., "Subpicosecond dynamics of confined excitons and optical nonlinearities of CuCI quantum dots," Journal of Luminescence 66 & 67 (1996) 406-409.
Efros et al., "Resonance Raman Spectroscopy of Electron-Hole Pairs—Polar Phonon Coupling in Semiconductor Quantum Microcrystals," Solid State Communications, vol. 78, No. 10, 853-856 (1991).
Ekimov et al., "Quantum size effect in three-dimensional microscopic semiconductor crystals," JETP Lett, vol. 34, No. 6, Sep. 20, 1981, pp. 345-349.
Ekimov et al., "Quantum size effect in the optical spectra of semiconductor microcrystals," Sov. Phys. Semicond. 16(7), Jul. 1982, pp. 775-778.
Ekimov et al., "Size quantization of the electron energy spectrum in a microscopic semiconductor crystal," JETP Lett., vol. 40, No. 8, Oct. 25, 1984, pp. 1136-1139.
Ekimov et al., "Quantum Size Effect in Semiconductor Microcrystals," Solid State Communications, vol. 56, No. 11, pp. 921-924 (1985).
Ekimov et al., "Quantization of the energy spectrum of holes in the adiabatic potential of the electron," JETP Lett., vol. 43, No. 6, Mar. 25, 1986, pp. 376-379.
Ekimov et al., "Nonlinear Optics of Semiconductor-Doped Glasses," Phys. Stat. Sol. (b) 150, (1988) pp. 627-633.
Ekimov et al., "Photoluminescence of quasizero-dimensional semiconductor structures," Sov. Phys. Solid State 31(8), Aug. 1989, pp. 1385-1393.
Ekimov et al., "Donor-like Exciton in Zero-Dimension Semiconductor Structures," Solid State Communications, vol. 69, No. 5, pp. 565-568 (1989).
Ekimov et al., "Influence of high hydrostatic pressures on the exciton spectrum of CdS microcrystals in glass," Sov. Phys. Semicond. 23(9), Sep. 1989, pp. 965-966.
Ekimov et al., "Quantum-Size Stark Effect in Semiconductor Microcrystals," Journal of Luminescence 46 (1990) 97-100 North-Holland.
Ekimov et al., "Spectra and Decay Kinetics of Radiative Recombination in CdS Microcrystals," Journal of Luminescence 46 (1990) 83-95 North-Holland.
Ekimov et al., "Optics of Zero Dimensional Semiconductor Systems, Acta Physica Polonica A," vol. 79 (1991), No. 1. pp. 5-14.
Ekimov, "Optical Properties of Semiconductor Quantum Dots in Glass Matrix," Physica Scripta, vol. T39, 217-222 (1991).
Ekimov et al., "Dimensional Effects in Luminescence Spectra of Zero-Dimensional Semiconductor Structures," Bulletin of the Russian Academy of Sciences, vol. 56, No. 2, pp. 154-157 (Feb. 1992).
Ekimov et al., "Absorption and intensity-dependent photoluminescence measurements on CdSe quantum dots: assignment of the first electronic transitions," Journal of the Optical Society of America, vol. 10, Nos. 1-12, 100-107 (1992).
Ekimov et al., "Growth of CdSe nanocrystals in ion-implanted $SiO_2$ films," Journal of Crystal Growth 151 (1995) 38-45.
Ekimov, "Optical Properties of Oxide Glasses Doped by Semiconductor Nanocrystals," Radiation Effects and Defects in Solids, 1995, vol. 134, 11-22.
Ekimov, "Growth and optical properties of semiconductor nanocrystals in a glass matrix," Journal of Luminescence 70 (1996) 1-20.
Empedocles et al, "Photoluminescence Spectroscopy of Single CdSe Nanocrystallite Quantum Dots" Phys. Rev. Lett. 77(18):3873-3876 (Oct. 1996).
Empedocles et al., "Quantum-Confined Stark Effect in Single CdSe Nanocrystallite Quantum Dots" Science 278:2114-2117 (Dec. 1997).
Gates et al., "New Approaches to Nanofabrication: Molding, Printing, and Other Techniques," Chem. Rev. 2005, 105, 1171-1196.
Geissler et al., "Patterning: Principles and Some New Developments," Adv. Mater. 2004, 16, 1249-1269.
Grabovskis, et al., "Photoionization of semiconducting microcrystals in glass," Sov. Phys. Solid State 31(1), Jan. 1989, pp. 149-151.
Guha et al., "Hybrid organic-inorganic semiconductor-based light-emitting diodes" J. Appl. Phys. 82(8):4126-4128 (Oct. 15, 1997).
Gurevich et al., "Growth of CdS nanocrystals in silicate glasses and in thin $SIO_2$ films in the Initial states of the phase separation of a solid solution," Semiconductors, 28 (5), May 1994, 486-493.
Gurevich et al. "Preparation and investigation of $SIO_2$ films activated by CdS semiconductor nanocrystals," Soviet Physics Semiconductors, vol. 26, 57-59 (1992).
Hammond, "Form and Function in Multilayer Assembly: New Applications at the Nanoscale," Adv. Mater. 2004, 16, 1271-1293.
Hines et al., "Synthesis and Characterization of Strongly Luminescing ZnS-Capped CdSe Nanocrystals" J. Phys. Chem. 100:468-471 (Jan. 1996).
Itoh et al., "Interface effects on the properties of confined excitons in CuCl microcrystals," Journal of Luminescence 60 & 61 (1994) 396-399.
Itoh et al., "Polaron and Exciton-Phonon Complexes in CuCl Nanocrystals," Physical Review Letters, vol. 74, No. 9, Feb. 27, 1995, 1645-1648.
Itoh et al., "Subpicosecond dynamics of confined excitons in CuCl nanocrystals," Materials Science and Engineering A217/218 (1996) 167-170.
Jursenas et al., "Surface Recombination of Nonequilibrium Electron-Hole Plasma in Laser-Modified Semiconductor-Doped Glasses," Solid State Communications, vol. 87, No. 6, 577-580 (1993).
Kagan et al., "Electronic Energy Transfer in CdSe Quantum Dot Solids," Physical Review Letters, 76:1517-1520 (1996).
Kagan et al., "Long-range resonance transfer of electronic excitations in close-packed CdSe quantum-dot solids," Physical Review Letters, 54:8633-8643 (Sep. 15, 1996).
Katayama et al., "Stable Capillary Coating with Successive Multiple Ionic Polymer Layers," Anal. Chem. 1998, 70, 2254-2260.
Kortan et al., "Nucleation and Growth of CdSe on ZnS Quantum Crystallite Seeds, and Vice Versa, In Inverse Micelle Media" J. Am Chem. Soc. 112:1327-1332 (1990).
Kumar et al., "Patterning Self-Assembled Monolayers: Applications in Materials Science," Langmuir 1994, 10, 1498-1511.
Kumar et al., "Features of gold having micrometer to centimeter dimensions can be formed through a combination of stamping with an elastomeric stamp and an alkanethiol 'ink' followed by chemical etching", Applied Physics Letters, 63, 2002-2004, (1993).
Kuno et al., "The band edge luminescence of surface modified CdSe nanocrystallites: Probing the luminescing state" J. Chem. Phys. 106(23):9869-9882 (Jun. 1997).
Lawless et al., "Bifunctional Capping of CdS Nanoparticles and Bridging to TiO2" J. Phys. Chem. 99:10329-10335 (1995).
Leatherdale et al., "Photoconductivity in CdSe Quantum Dot Solids," vol. 62, No. 4, pp. 2669-2680, (Jul. 15, 2000).

(56) References Cited

OTHER PUBLICATIONS

Lin et al., "Formation of Long-Range-Ordered Nanocrystal Superlattices on Silicon Nitride Substrates", J. Phys. Chem. B, 105, 3353-3357, (2001).
Lublinskaya et al., "CdS nanocrystal growth in thin silica films: evolution of size distribution function", Journal of Crystal Growth 184/185 (1998) 360-364.
Makamba et al., "Surface modification of poly(dimethylsiloxane) microchannels," Electrophoresis 2003, 24, 3607-3619.
Matsumoto et al., "Preparation of Monodisperse CdS Nanocrystals by Size Selective Photocorrosion", J. Phys. Chem.100(32):13781-13785 (1996).
Mattoussi et al., "Electroluminescence from heterostructures of poly(phenylene vinylene) and inorganic CdSe nanocrystals," J. Appl. Phys. 83(12): 7965-7974, 1998.
Murray et al., "Synthesis and Characterization of Nearly Monodisperse CdE (E=S, Se, Te) Semiconductor Nanocrystallites", J. Am. Chem. Soc. 115(19):8706-8715 (1993).
Nirmal et al., "Fluorescence Intermittency in single Cadmium Selenide Nanocrystals" Nature 383:802-804 (Oct. 1996).
Nitsche et al., "Determination of model-free Kramers-Kronig consistent optical constants of thin absorbing films from just one spectral measurement: Application to organic semiconductors," Phys. Rev. B 2004, 70, 195432.
Park et al., "Multilayer Transfer Printing for Polyelectrolyte Multilayer Patterning: Direct Transfer of Layer-by-Layer Assembled Micropatterned," Thin Films Adv. Mater. 2004, 16, 520-525.
Santhanam et al., "Self-Assembly of Uniform Monolayer Arrays of Nanoparticles", Langmuir, 19, 7881-7887, (2003).
Santhanam et al., "Microcontact Printing of Uniform Nanoparticle Arrays", Nano Letters, 4, 41-44, (2004).
Saviot et al., "Effects of Resonance on Low-Frequency Raman Scattering From Semiconductor Nanocrystals," Radiation Effects and Defects in Solids, 1995, vol. 137, 45-50.
Saviot et al., "Size dependence of acoustic and optical vibrational modes of CdSe nanocrystals in glasses," Journal of Non-Crystalline Solids 197 (1996) 238-246.
Saviot et al., "Size-selective resonant Raman scattering in CdS doped glasses," Physical Review B, vol. 57, No. 1, Jan. 1, 1998—I, 341-346.
Schlamp et al., "Improved efficiencies in light emitting diodes made with CdSe(CdS) core/shell type nanocrystals and a semiconducting polymer", J. Appl. Phys., 82, 5837-5842 (1997).
Sirenko et al., "Spin-flip and acoustic-phonon Raman scattering in CdS nanocrystals", Physical Review B, vol. 58, No. 4, 15 (Jul. 1998—II), 2077-2087.
Spanhel et al., "Photochemistry of Colloidal Semiconductors. Surface Modification and Stability of Strong Luminescing CdS Particles" J. Am. Chem. Soc.109(19):5649-5655 (1987).
Tamulaitis et al., "Dynamics of Nonlinear Optical Response of CuBr-Doped Glasses," Superlattices and Microstructures, vol. 3, No. 2, 199-202 (1993).
Tisch Ler et al., "Strong Coupling in a Microcavity LED," Phys. Rev. Lett. 2005, 95, 036401.
Valenta et al., "Dynamics of excitons in CuBr nanocrystals: Spectral-hole burning and transient four-wave-mixing measurements," Physical Review B, vol. 57, No. 3, 15 Jan. 1998-1, 1774-1783.
Vandyshev et al., "Nonlinear optical properties of semiconductor microcrystals," JETP Lett., vol. 46, No. 10, Nov. 25, 1987 pp. 435-439.
Volkov et al., "Oscillations of polarization of recombination radiation of a variable gap semiconductor in a magnetic field," JETP Lett., vol. 25 No. 55, 526-528 (1977).
Wilbur et al., "Microfabrication by Microcontact Printing of Self-Assembled Monolayers," *Adv. Mater.* 1994, 6, 600.
Xia et al., "Soft Lithography," Annual Review of Materials Science 1998, 28, 153-184.
Xia et al., "Unconventional Methods for Fabricating and Patterning Nanostructures," Chem. Rev. 1999, 99, 1823-1848.
Yamasaki et al., "Organic light-emitting device with an ordered monolayer of silica microspheres as a scattering medium", Appl. Phys. Lett. 76, 1243-1245 (2000).
Chan et al., "Multiexcitonic two-state lasing in a CdSe nanocrystal laser," 2004, Appl. Phys. Lett., vol. 85, No. 13, pp. 2460-2462.
Meitl et al., "Transfer printing by kinetic control of adhesion to an elastomeric stamp." Nature Materials, 5: 33-38 (2005).
Leet et al., "Organic light-emitting diodes formed by soft contact lamination." PNAS, 101(2): 429-433 (2004).
Coe-Sullivan et al., (2002) "Electroluminescence from single monolayers of nanocrystals in molecular organic devices," *Nature*, 420: 800-803.
Maenosono et al., (2003) "Overview of nanoparticle array formation by wet coating," *Journal of Nanoparticle Research*, 5: 5-15.
Office Action for corresponding TW Application No. 94136895, completed May 29, 2013.
Santhanam, V. et al., "Microcontact Printing of Uniform Nanoparticles Arrays," *Nano Letters*, vol. 4, No. 1, Dec. 2003, pp. 41-44.
Coe-Sullivan, S. et al., "Tuning the performance of hybrid organic/inorganic quantum dot light-emitting devices," *Organic Electronics*, vol. 4, 2003, pp. 123-130.
Maenosono, S. et al., "Overview of nanoparticle array formation by wet coating," *Journal of Nanoparticles Research*, vol. 5, Feb. 2003, pp. 5-15.
Fiore, A. et al., "High-Efficiency Light-Emitting Diodes at 1.3µm Using InAs—InGaAs Quantum Dots," *IEEE Photonic Technology Letters*, vol. 12, No. 12, Dec. 2003, pp. 1601-1603.

\* cited by examiner

LIGHT EMITTING DEVICE INCLUDING SEMICONDUCTOR NANOCRYSTALS

CLAIM OF PRIORITY

This application claims priority to provisional U.S. Patent Application No. 60/620,967, filed Oct. 22, 2004, and to provisional U.S. Patent Application No. 60/629,579, filed Nov. 22, 2004, each of which is incorporated by reference in its entirety.

FEDERALLY SPONSORED RESEARCH OR DEVELOPMENT

This invention was made with government support under Grant Number DMR-0213282, awarded by the National Science Foundation, and Grant Number DAAD19-02-D-0002, awarded by the Army Research Office. The Government has certain rights in this invention.

TECHNICAL FIELD

The present invention relates to light emitting devices including semiconductor nanocrystals.

BACKGROUND

Light-emitting devices can be used, for example, in displays (e.g., flat-panel displays), screens (e.g., computer screens), and other items that require illumination. Accordingly, the brightness of the light-emitting device is one important feature of the device. Also, low operating voltages and high efficiencies can be desirable features of emissive devices.

Light-emitting devices can release photons in response to excitation of an active component of the device. Emission can be stimulated by applying a voltage across the active component (e.g., an electroluminescent component) of the device. The electroluminescent component can be a polymer, such as a conjugated organic polymer or a polymer containing electroluminescent moieties or layers of organic molecules. Typically, the emission can occur by radiative recombination of an excited charge between layers of a device. The emitted light has an emission profile that includes a maximum emission wavelength, and an emission intensity, measured in luminance (candelas/square meter ($cd/m^2$) or power flux ($W/m^2$)). The emission profile, and other physical characteristics of the device, can be influenced by the electronic structure (e.g., energy gaps) of the material. The brightness, range of colors emitted, efficiency, operating voltage, and operating half-lives of light-emitting devices can vary based on the structure of the device.

SUMMARY

In general, a light emitting device can include a plurality of semiconductor nanocrystals. Semiconductor nanocrystals are nanometer-scale inorganic semiconductor particles which are typically decorated with a layer of organic ligands. These zero-dimensional semiconductor structures show strong quantum confinement effects that can be harnessed in designing bottom-up chemical approaches to create complex heterostructures with electronic and optical properties that are tunable with the size and composition of the nanocrystals.

The semiconductor nanocrystals can be used as the lumophore in a light emitting device. Because semiconductor nanocrystals have narrow emission linewidths, are photoluminescent efficient, and emission wavelength tunable, they can be a desirable lumophore. Semiconductor nanocrystals can be dispersed in solution and are therefore compatible with thin-film deposition techniques such as spin-casting, drop-casting, and dip coating. However, neat semiconductor nanocrystal solids resulting from these deposition techniques have poor electrical transport properties in solid state light emitting devices. Rather than a neat solid, a monolayer of semiconductor nanocrystals can be used in a light emitting device. A monolayer provides the beneficial light emission properties of semiconductor nanocrystals while minimizing the impact on electrical performance.

Semiconductor nanocrystal monolayers are typically self-assembled out of solution, such as by spin-casting, Langmuir-Blodgett techniques, or drop-casting. Some techniques for depositing semiconductor nanocrystal monolayers can place constraints on the substrate used, require the addition of chemicals that effect the electrical or optical properties of the layer, subject the substrate to harsh conditions, or constrain the types of devices that can be grown in some way. Furthermore, these techniques do not allow the monolayer to be laterally patterned. These two traits make the available techniques less than ideal for assembly of multiple color LEDs on a single substrate, or for device engineering.

Semiconductor nanocrystals can be deposited on a substrate using microcontact printing. Advantageously, microcontact printing allows micron-scale (e.g., less than 1 mm, less than 500 µm, less than 200 µm, or less than 100 µm) patterning of features on a surface. Pattern features can be applied at larger scales, such as 1 mm or greater, 1 cm or greater, 1 m or greater, or 10 m or greater. In particular, a monolayer of semiconductor nanocrystals can be deposited by microcontact printing. This approach allows dry (i.e., solvent free) application of a patterned semiconductor nanocrystal film to a substrate, thus freeing the substrate of solubility and surface chemistry requirements.

Microcontact printing of semiconductor nanocrystal monolayers can be used to make saturated color red, green and blue LEDs including semiconductor nanocrystals, to place multiple such LEDs of different colors onto a single substrate, and to form LED patterns at the micron scale (<100 µm). The deposition process is scalable, and can allow inexpensive manufacturing of LEDs over a large surface area.

In one aspect, a method of forming a device includes placing a nanomaterial on a surface of an applicator and contacting the surface of the applicator to a substrate including a first electrode, thereby transferring at least a portion of the nanomaterial to the substrate, and arranging a second electrode opposed to the first electrode.

The surface of the applicator can include a pattern including an elevation or a depression. The nanomaterial can include a plurality of semiconductor nanocrystals. The plurality of semiconductor nanocrystals can form a layer on the substrate. The layer can be a multilayer, a monolayer, or a partial monolayer of semiconductor nanocrystals. The nanomaterial can form a layer on the substrate. The layer can be a multilayer, a monolayer, or a partial monolayer of the nanomaterial. The nanomaterial can form a pattern on the substrate.

The method can include modifying the surface of the applicator before placing the nanomaterial on the surface of the applicator. Modifying the surface of the applicator can include contacting the surface of the applicator with a composition selected to release at least a portion of the nanomaterial from the applicator upon contact with a substrate. The composition can include an aromatic organic polymer.

The method can include placing a second nanomaterial on a surface of a second applicator and contacting the surface of the second applicator to a substrate, thereby transferring at least a portion of the second nanomaterial to the substrate. The first and second nanomaterials can each independently include a plurality of semiconductor nanocrystals. The first plurality of semiconductor nanocrystals can have an emission wavelength distinguishable from the second plurality of semiconductor nanocrystals.

The method can include placing a third plurality of semiconductor nanocrystals on a surface of a third applicator and contacting the surface of the third applicator to the substrate, thereby transferring at least a portion of the third plurality of semiconductor nanocrystals to the substrate. The third plurality of semiconductor nanocrystals can have an emission wavelength distinguishable from the first plurality of semiconductor nanocrystals, and distinguishable from the second plurality of semiconductor nanocrystals. The first, second and third pluralities of semiconductor nanocrystals can be applied in non-overlapping predefined regions of the substrate. The emission wavelengths of the first, second and third pluralities of semiconductor nanocrystals can be selected from an ultraviolet, blue, green, yellow, red, or infrared emission wavelength, or a combination thereof.

A feature of the pattern can have a dimension of less than 10 millimeters, less than 1 millimeter, less than 100 micrometers, or less than 1 micrometer. A feature of the pattern can have a dimension of at least 1 centimeter, at least 10 centimeters, or at least 100 centimeters.

The substrate can include a layer including a hole transport material over the electrode. The method can include forming a layer including an electron transporting material over the nanomaterial. A second electrode can be applied over the layer including an electron transporting material.

Placing the nanomaterial on a surface of the applicator can include spin coating, blade coating, slot coating, dip coating, spray coating, rod coating, reverse roll coating, forward roll coating, air knife coating, knife over roll coating, gravure, microgravure, extrusion coating, slide coating, curtain coating, or a combination thereof. The surface of the applicator can be substantially free of elevations and depressions. The applicator can be mounted on a rotatable drum.

In another aspect, a light emitting device includes a first electrode, a second electrode opposed to the first electrode, and a predefined region including a monolayer of semiconductor nanocrystals disposed between the first electrode and the second electrode.

The predefined region can form a pattern. The device can include a second predefined region including a second monolayer of semiconductor nanocrystals. The first monolayer of semiconductor nanocrystals can have an emission wavelength distinct from an emission wavelength of the second monolayer.

The device can include a layer including a hole transport material disposed proximal to the first electrode and between the first electrode and the second electrode. The device can also include a layer including an electron transport material disposed proximal to the second electrode and between the first electrode and the second electrode. The predefined region including the monolayer of semiconductor nanocrystals can be disposed between the layer including a hole transport material and the layer including an electron transport material.

In another aspect, a method of generating light includes providing a device including a first electrode, a second electrode opposed to the first electrode, and a predefined region including a monolayer of semiconductor nanocrystals disposed between the first electrode and the second electrode, and applying a voltage across the first electrode and the second electrode. Applying a voltage can include passing a current between the first electrode and the second electrode.

In another aspect, a display includes a plurality of light emitting devices, where at least one light emitting device includes a first electrode, a second electrode opposed to the first electrode, and a predefined region including a monolayer of semiconductor nanocrystals disposed between the first electrode and the second electrode. The display can include a second light emitting device including a first electrode, a second electrode opposed to the first electrode, and a predefined region including a monolayer of semiconductor nanocrystals disposed between the first electrode and the second electrode.

The first light emitting device can have an emission wavelength distinguishable from an emission wavelength of the second light emitting device. The display can include a third light emitting device including a first electrode, a second electrode opposed to the first electrode, and a predefined region including a monolayer of semiconductor nanocrystals disposed between the first electrode and the second electrode. The third light emitting device has an emission wavelength distinguishable from an emission wavelength of the second light emitting device, and from an emission wavelength of the first light emitting device.

The display can include a fourth light emitting device including a first electrode, a second electrode opposed to the first electrode, and a predefined region including a monolayer of semiconductor nanocrystals disposed between the first electrode and the second electrode. The fourth light emitting device has an emission wavelength distinguishable from an emission wavelength of the third light emitting device, from an emission wavelength of the second light emitting device, and from an emission wavelength of the first light emitting device.

The light emitting device can have a dimension of less than 10 millimeters, of less than 1 millimeter, or of less than 100 micrometers. The display can include a backplane, which can include active matrix or passive matrix electronics.

In another aspect, a display includes a plurality of light emitting devices including a first electrode, a second electrode opposed to the first electrode, and a predefined region including a monolayer of semiconductor nanocrystals disposed between the first electrode and the second electrode. The semiconductor nanocrystals of each light emitting device can have an emission wavelength selected from an ultraviolet, blue, green, yellow, red, or infrared emission wavelength, or a combination thereof Other features, objects, and advantages of the invention will be apparent from the description and drawings, and from the claims.

DETAILED DESCRIPTION

A light emitting device can include two layers (or more) separating two electrodes of the device. The material of one layer can be chosen based on the material's ability to transport holes, or the hole transporting layer (HTL). The material of the other layer can be chosen based on the material's ability to transport electrons, or the electron transporting layer (ETL). The electron transporting layer typically includes an electroluminescent layer. When a voltage is applied, one electrode injects holes (positive charge carriers) into the hole transporting layer, while the other electrode injects electrons into the electron transporting layer. The injected holes and electrons each migrate toward the oppositely charged electrode. When an electron and a hole localize on the same molecule, an exciton is formed, which can recombine to emit light.

Figure 1:
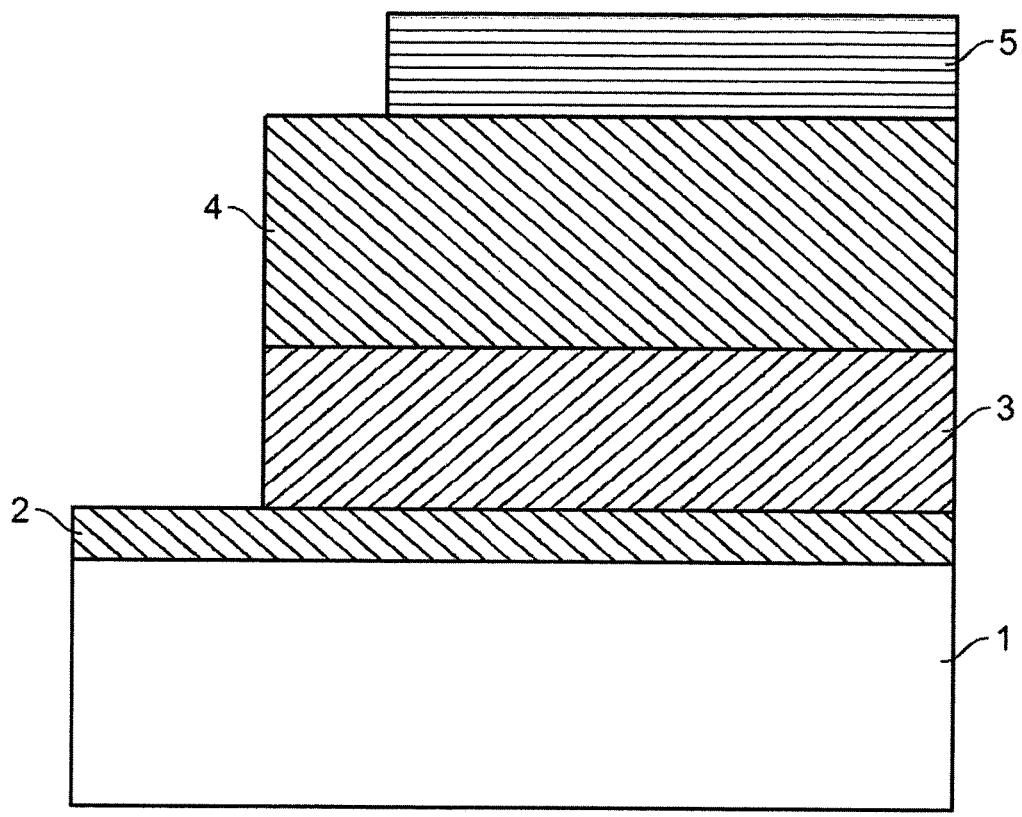
FIG. 1 is a schematic drawing depicting a light-emitting device.

A light emitting device can have a structure such as shown in FIG. 1, in which a first electrode 2, a first layer 3 in contact with the electrode 2, a second layer 4 in contact with the layer 3, and a second electrode 5 in contact with the second layer 4. First layer 3 can be a hole transporting layer and second layer 4 can be an electron transporting layer. At least one layer can be non-polymeric. Alternatively, a separate emissive layer (not shown in FIG. 1) can be included between the hole transporting layer and the electron transporting layer. One of the electrodes of the structure is in contact with a substrate 1. Each electrode can contact a power supply to provide a voltage across the structure. Electroluminescence can be produced by the emissive layer of the heterostructure when a voltage of proper polarity is applied across the heterostructure. First layer 3 can include a plurality of semiconductor nanocrystals, for example, a substantially monodisperse population of nanocrystals. Alternatively, a separate emissive layer can include the plurality of nanocrystals. A layer that includes nanocrystals can be a monolayer of nanocrystals.

Light emitting devices including semiconductor nanocrystals can be made by spin-casting a solution containing the HTL organic semiconductor molecules and the semiconductor nanocrystals, where the HTL formed underneath of the semiconductor nanocrystal monolayer via phase separation (see, for example, U.S. patent application Ser. Nos. 10/400,907 and 10/400,908, both filed Mar. 28, 2003, each of which is incorporated by reference in its entirety). This phase separation technique reproducibly placed a monolayer of semiconductor nanocrystals between an organic semiconductor HTL and ETL, thereby effectively exploiting the favorable light emission properties of semiconductor nanocrystals, while minimizing their impact on electrical performance. Devices made by this technique were limited by impurities in the solvent, and by the necessity to use organic semiconductor molecules that are soluble in the same solvents as the semiconductor nanocrystals. The phase separation technique was unsuitable for depositing a monolayer of semiconductor nanocrystals on top of both a HTL and a HIL (due to the solvent destroying the underlying organic thin film). Nor did the phase separation method allow control of the location of semiconductor nanocrystals that emit different colors on the same substrate. Similarly, the phase separation method did not allow patterning of the different color emitting nanocrystals on the same substrate.

The substrate can be opaque or transparent. The substrate can be rigid or flexible. The substrate can be plastic, metal or glass. The first electrode can be, for example, a high work function hole-injecting conductor, such as an indium tin oxide (ITO) layer. Other first electrode materials can include gallium indium tin oxide, zinc indium tin oxide, titanium nitride, or polyaniline. The second electrode can be, for example, a low work function (e.g., less than 4.0 eV), electron-injecting, metal, such as Al, Ba, Yb, Ca, a lithium-aluminum alloy (Li:Al), or a magnesium-silver alloy (Mg:Ag). The second electrode, such as Mg:Ag, can be covered with an opaque protective metal layer, for example, a layer of Ag for protecting the cathode layer from atmospheric oxidation, or a relatively thin layer of substantially transparent ITO. The first electrode can have a thickness of about 500 Angstroms to 4000 Angstroms. The first layer can have a thickness of about 50 Angstroms to about 1000 Angstroms. The second layer can have a thickness of about 50 Angstroms to about 1000 Angstroms. The second electrode can have a thickness of about 50 Angstroms to greater than about 1000 Angstroms.

The electron transporting layer (ETL) can be a molecular matrix. The molecular matrix can be non-polymeric. The molecular matrix can include a small molecule, for example, a metal complex. For example, the metal complex can be a metal complex of 8-hydroxyquinoline. The metal complex of 8-hydroxyquinoline can be an aluminum, gallium, indium, zinc or magnesium complex, for example, aluminum tris(8-hydroxyquinoline) (Alq$_3$). Other classes of materials in the ETL can include metal thioxinoid compounds, oxadiazole metal chelates, triazoles, sexithiophene derivatives, pyrazine, and styrylanthracene derivatives. The hole transporting layer can include an organic chromophore. The organic chromophore can be a phenyl amine, such as, for example, N,N'-diphenyl-N,N'-bis(3-methylphenyl)-(1,1'-biphenyl)-4,4'-diamine (TPD). The HTL can include a polyaniline, a polypyrrole, a poly(phenylene vinylene), copper phthalocyanine, an aromatic tertiary amine or polynuclear aromatic tertiary amine, a 4,4'-bis(9-carbazolyl)-1,1'-biphenyl compound, or an N,N,N',N'-tetraarylbenzidine.

The layers can be deposited on a surface of one of the electrodes by spin coating, dip coating, vapor deposition, or other thin film deposition methods. See, for example, M. C. Schlamp, et al., *J. Appl. Phys.*, 82, 5837-5842, (1997); V. Santhanam, et al., *Langmuir,* 19, 7881-7887, (2003); and X. Lin, et al., *J. Phys. Chem. B,* 105, 3353-3357, (2001), each of which is incorporated by reference in its entirety. The second electrode can be sandwiched, sputtered, or evaporated onto the exposed surface of the solid layer. One or both of the electrodes can be patterned. The electrodes of the device can be connected to a voltage source by electrically conductive pathways. Upon application of the voltage, light is generated from the device.

Microcontact printing provides a method for applying a material to a predefined region on a substrate. See, for example, A. Kumar and G. Whitesides, *Applied Physics Letters,* 63, 2002-2004, (1993); and V. Santhanam and R. P. Andres, *Nano Letters,* 4, 41-44, (2004), each of which is incorporated by reference in its entirety. The predefined region is a region on the substrate where the material is selectively applied. The material and substrate can be chosen such that the material remains substantially entirely within the predetermined area. By selecting a predefined region that forms a pattern, material can be applied to the substrate such that the material forms a pattern. The pattern can be a regular pattern (such as an array, or a series of lines), or an irregular pattern. Once a pattern of material is formed on the substrate, the substrate can have a region including the material (the predefined region) and a region substantially free of material. In some circumstances, the material forms a monolayer on the substrate. The predefined region can be a discontinuous region. In other words, when the material is applied to the predefined region of the substrate, locations including the material can be separated by other locations that are substantially free of the material.

In general, microcontact printing begins by forming a patterned mold. The mold has a surface with a pattern of elevations and depressions. A stamp is formed with a complementary pattern of elevations and depressions, for example by coating the patterned surface of the mold with a liquid polymer precursor that is cured while in contact with the patterned mold surface. The stamp can then be inked; that is, the stamp is contacted with a material which is to be deposited on a substrate. The material becomes reversibly adhered to the stamp. The inked stamp is then contacted with the substrate. The elevated regions of the stamp can contact the substrate while the depressed regions of the stamp can be separated from the substrate. Where the inked stamp contacts the substrate, the ink material (or at least a portion thereof) is transferred from the stamp to the substrate. In this way, the pattern of elevations and depressions is transferred from the stamp to the substrate as regions including the material and free of the material on the substrate. Microcontact printing and related techniques are described in, for example, U.S. Pat. Nos. 5,512,131; 6,180,239; and 6,518,168, each of which is incorporated by reference in its entirety.

Figure 2:
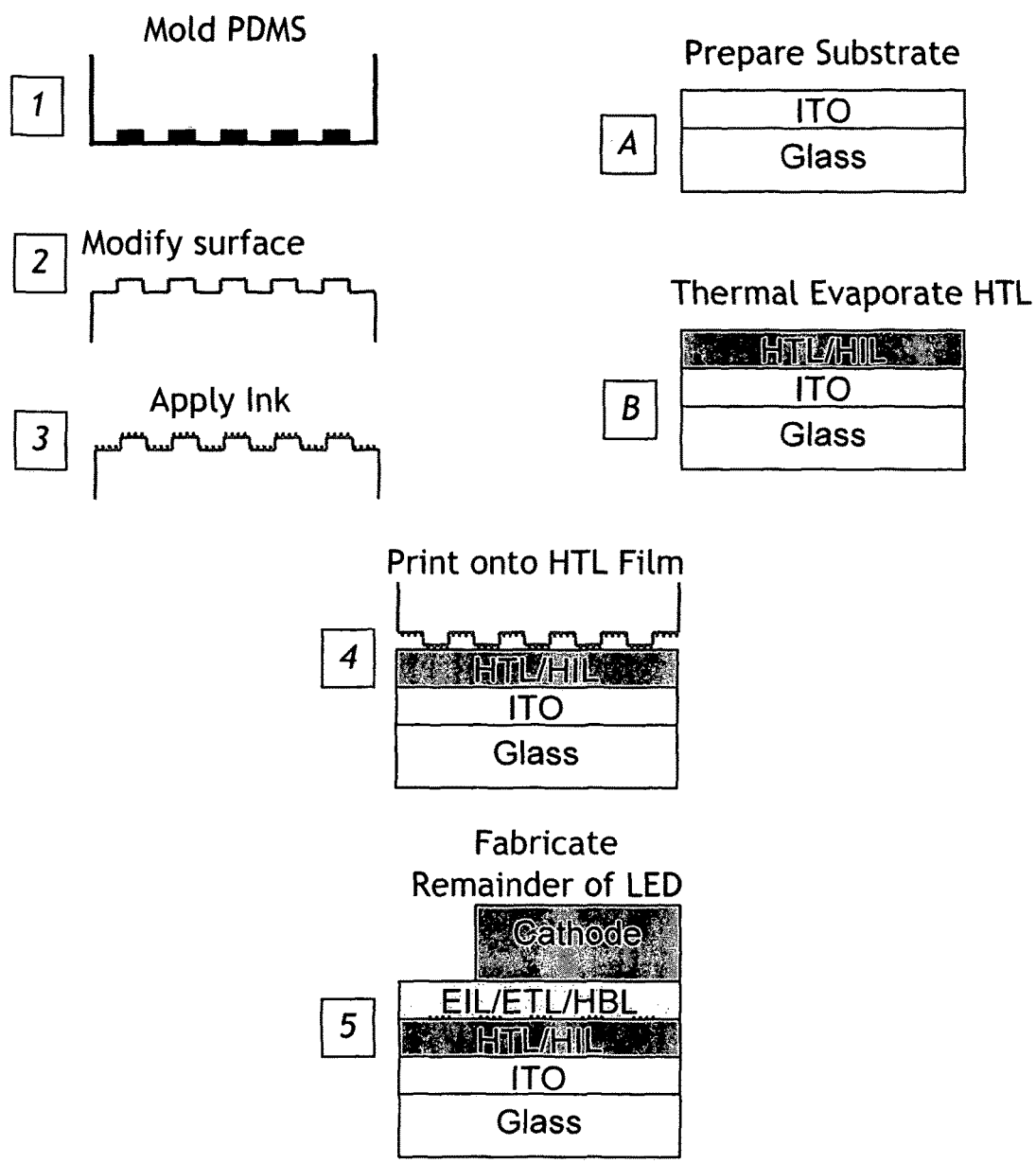
FIG. 2 is a diagram depicting a method of forming a light-emitting device.

FIG. 2 depicts a flow chart outlining the basic steps in the microcontact printing process. First, a silicon master is made using standard semiconductor processing techniques which define a pattern on the silicon surface, for example a pattern of elevations and depressions (alternatively, for a non-patterned deposition, a blank Si master can be used). Poly dimethyl siloxane (PDMS, for example Sylgard 184) precursors are then mixed, degassed, poured onto the master, and degassed again, and allowed to cure at room temperature (or above room temperature, for faster cure times) (step 1). The PDMS stamp, having a surface including the pattern of the silicon master, is then freed from the master, and cut into the desired shape and size. This stamp can then optionally be modified with a surface chemistry layer, selected to readily adhere and release the ink as needed (step 2). The surface chemistry layer can be both a barrier to stamp swelling by the ink solvent, and an adhesion/release layer for the ink. Aromatic organic polymers, deposited by chemical vapor deposition, can be used as a surface chemistry layer. See, for example, S. Coe-Sullivan, et al., *Advanced Functional Materials,* 15, 1117-1124 (2005), which is incorporated by reference in its entirety. Application of the surface chemistry layer by chemical vapor deposition can result in a conformal coating of the shaped stamp. The surface chemistry layer can be chosen to compatible with spreading of chloroform-solvated inks. Ink is then applied to the stamp (step 3). The inked stamp can then be contacted to a substrate, and gentle pressure applied for 30 seconds to transfer the ink to the new substrate (step 4).

The ink can include a nanomaterial. A nanomaterial can be any material having a dimension smaller than 100 nm. The nanomaterial can be, for example, a nanoparticle (e.g., a silica nanoparticle, a titania nanoparticle, or a metal nanoparticle), a semiconductor nanocrystal, a nanotube (such as a single walled or multi-walled carbon nanotube), a nanowire, a nanorod, or a polymer.

For example, the surface chemistry layer can be a chemical vapor deposited Parylene-C layer. The Parylene-C layer can be, for example, 0.1 to 2 μm thick, depending on the pattern to be reproduced (step 2). This stamp is then inked by spin-casting of a solution of semiconductor nanocrystals (step 3). The solution can have, for example, a concentration of 1-10 mg/mL of semiconductor nanocrystals dispersed in chloroform. The concentration can be varied depending on desired outcome. The inked stamp can then be contacted to a substrate, and gentle pressure applied for 30 seconds to transfer the ink (i.e., a semiconductor nanocrystal monolayer) completely to the new substrate (step 4). FIGS. 2A and 2B depict the preparation of an ITO coated glass substrate. A hole transport and/or a hole injection layer (HTL and HIL, respectively) including organic semiconductor is thermally evaporated onto the ITO substrate. The patterned semiconductor nanocrystal monolayer is transferred to this HTL layer, and the rest of the device (e.g., electron transport layer (ETL), electron injection layer (EIL), and metal contacts) can then be added (step 5).

Figure 3:
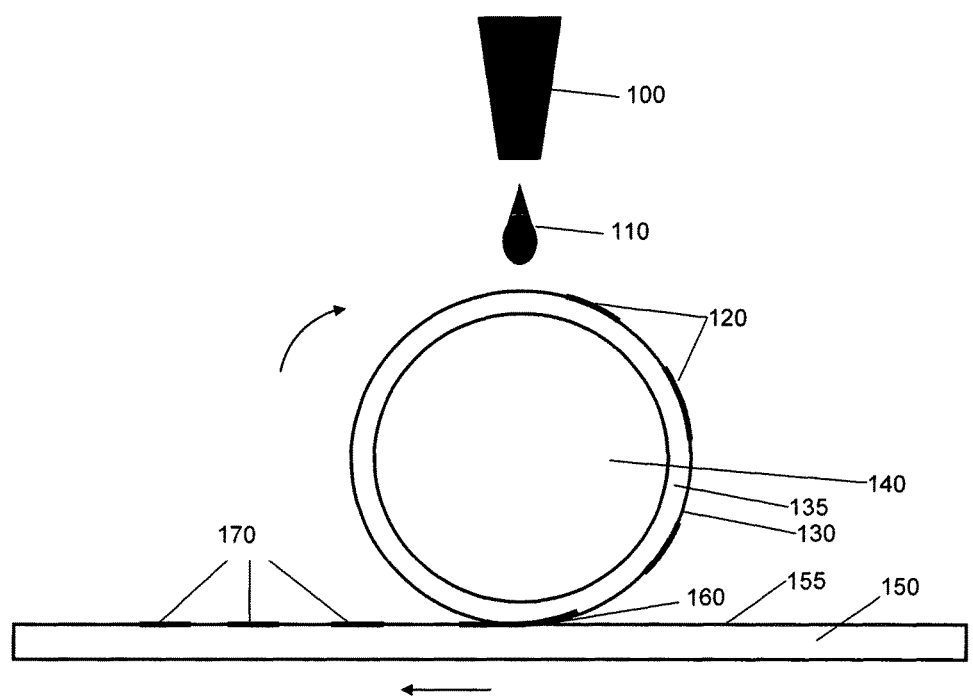
FIG. 3 is a diagram depicting a method of applying a material to a substrate.

FIG. 3 depicts a system for forming a pattern of a material on a substrate. Liquid applicator 100 delivers ink droplets 110 which form ink spots 120 on printing surface 130 of stamp 135. Ink droplets 110 can be applied continuously or intermittently. A continuous application can lead to a continuous ink feature on the substrate, whereas intermittent application can result in the formation of an ink pattern on the substrate. The nature of the pattern can be controlled by controlling the timing and droplet sizes applied by applicator 100. Stamp 135 can be, for example, a cylindrical stamp mounted on the circumference of rotating drum 140. Stamp 135 (which can be a textured or featureless stamp) contacts surface 155 of substrate 150 at contact point 160. As the rotating drum 140 turns (indicated by curved arrow), ink spots 120 reach contact point 160, where they are transferred to surface 155 of substrate 150 (moving in the direction indicated by the straight arrow), forming transferred ink spots 170. Drum 140 and stamp 135 can be configured to apply pressure to substrate 150 at contact point 160, in order facilitate transfer of ink spots 120. The system can be operated continuously.

When the electron and hole localize on a nanocrystal, emission can occur at an emission wavelength. The emission has a frequency that corresponds to the band gap of the quantum confined semiconductor material. The band gap is a function of the size of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue, or to higher energies, as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region. The narrow size distribution of a population of nanocrystals can result in emission of light in a narrow spectral range. The population can be monodisperse and can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) can be observed. The breadth of the emission decreases as the dispersity of nanocrystal diameters decreases. Semiconductor nanocrystals can have high emission quantum efficiencies such as greater than 10%, 20%, 30%, 40%, 50%, 60%, 70%, or 80%.

The semiconductor forming the nanocrystals can include Group II-VI compounds, Group II-V compounds, Group III-VI compounds, Group III-V compounds, Group IV-VI compounds, Group I-III-VI compounds, Group II-IV-VI compounds, or Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. Pat. Nos. 6,322,901 and 6,576,291, and U.S. Patent Application No. 60/550,314, each of which is incorporated by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis (silyl)chalcogenide, dioxygen, an ammonium salt, or a tris (silyl)pnictide. Suitable X donors include dioxygen, bis (trimethylsilyl)selenide ((TMS)$_2$Se), trialkyl phosphine selenides such as (tri-n-octylphosphine)selenide (TOPSe) or (tri-n-butylphosphine)selenide (TBPSe), trialkyl phosphine tellurides such as (tri-n-octylphosphine)telluride (TOPTe) or hexapropylphosphorustriamide telluride (HPPTTe), bis(trimethylsilyl)telluride ((TMS)$_2$Te), bis(trimethylsilyl)sulfide ((TMS)$_2$S), a trialkyl phosphine sulfide such as (tri-n-octylphosphine)sulfide (TOPS), an ammonium salt such as an ammonium halide (e.g., NH$_4$Cl), tris(trimethylsilyl)phosphide ((TMS)$_3$P), tris(trimethylsilyl)arsenide ((TMS)$_3$As), or tris(trimethylsilyl)antimonide ((TMS)$_3$Sb). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP), tri-n-octyl phosphine oxide (TOPO) and trishydroxylpropylphosphine (tHPP). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The core can have an overcoating on a surface of the core. The overcoating can be a semiconductor material having a composition different from the composition of the core. The overcoat of a semiconductor material on a surface of the nanocrystal can include a Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating can be between 1 and 10 monolayers thick.

The particle size distribution can be further refined by size selective precipitation with a poor solvent for the nanocrystals, such as methanol/butanol as described in U.S. Pat. No. 6,322,901. For example, nanocrystals can be dispersed in a solution of 10% butanol in hexane. Methanol can be added dropwise to this stirring solution until opalescence persists.

Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include a layer of compounds derived from the coordinating solvent used during the growth process. The surface can be modified by repeated exposure to an excess of a competing coordinating group to form an overlayer. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal. Nanocrystal outer layers are described in U.S. Pat. No. 6,251,303, which is incorporated by reference in its entirety.

More specifically, the coordinating ligand can have the formula:

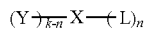

wherein k is 2, 3 or 5, and n is 1, 2, 3, 4 or 5 such that k-n is not less than zero; X is O, S, S=O, SO$_2$, Se, Se=O, N, N=O, P, P=O, As, or As=O; each of Y and L, independently, is aryl, heteroaryl, or a straight or branched C$_{2-12}$ hydrocarbon chain optionally containing at least one double bond, at least one triple bond, or at least one double bond and one triple bond. The hydrocarbon chain can be optionally substituted with one or more C$_{1-4}$ alkyl, C$_{2-4}$ alkenyl, C$_{2-4}$ alkynyl, C$_{1-4}$ alkoxy, hydroxyl, halo, amino, nitro, cyano, C$_{3-5}$ cycloalkyl, 3-5 membered heterocycloalkyl, aryl, heteroaryl, C$_{1-4}$ alkylcarbonyloxy, C$_{1-4}$ alkyloxycarbonyl, C$_{1-4}$ alkylcarbonyl, or formyl. The hydrocarbon chain can also be optionally interrupted by —O—, —S—, —N(R$^a$)—, —N(R$^a$)—C(O)—O—, —O—C(O)—N(R$^a$)—, —N(R$^a$)—C(O)—N(R$^b$)—, —O—C(O)—O—, —P(R$^a$)—, or —P(O)(R$^a$)—. Each of R$^a$ and R$^b$, independently, is hydrogen, alkyl, alkenyl, alkynyl, alkoxy, hydroxylalkyl, hydroxyl, or haloalkyl.

An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyiridyl, pyrrolyl, phenanthryl.

A suitable coordinating ligand can be purchased commercially or prepared by ordinary synthetic organic techniques, for example, as described in J. March, *Advanced Organic Chemistry*, which is incorporated by reference in its entirety.

Transmission electron microscopy (TEM) can provide information about the size, shape, and distribution of the nanocrystal population. Powder X-ray diffraction (XRD) patterns can provide the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis absorption spectrum.

The device can be made in a controlled (oxygen-free and moisture-free) environment, preventing the quenching of luminescent efficiency during the fabrication process. Other multilayer structures may be used to improve the device performance (see, for example, U.S. patent application Ser. Nos. 10/400,908 and 10/400,908, each of which is incorporated by reference in its entirety). A blocking layer, such as an electron blocking layer (EBL), a hole blocking layer (HBL) or a hole and electron blocking layer (eBL), can be introduced in the structure. A blocking layer can include 3-(4-biphenylyl)-4-phenyl-5-tert-butylphenyl-1,2,4-triazole (TAZ), 3,4,5-triphenyl-1,2,4-triazole, 3,5-bis(4-tert-butylphenyl)-4-phenyl-1,2,4-triazole, bathocuproine (BCP), 4,4',4"-tris{N-(3-methylphenyl)-N-phenylamino}triphenylamine (m-MTDATA), polyethylene dioxythiophene (PEDOT), 1,3-bis(5-(4-diphenylamino)phenyl-1,3,4-oxadiazol-2-yl)benzene, 2-(4-biphenylyl)-5-(4-tert-butylphenyl)-1,3,4-oxadiazole, 1,3-bis[5-(4-(1,1-dimethylethyl)phenyl)-1,3,4-oxadiazol-2-yl]benzene, 1,4-bis(5-(4-diphenylamino)phenyl-1,3,4-oxadiazol-2-yl)benzene, or 1,3,5-tris[5-(4-(1,1-dimethylethyl)phenyl)-1,3,4-oxadiazol-2-yl]benzene.

The performance of organic light emitting devices can be improved by increasing their efficiency, narrowing or broadening their emission spectra, or polarizing their emission. See, for example, Bulović et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety. Nanocrystals can be included in efficient hybrid organic/inorganic light emitting devices.

The narrow FWHM of nanocrystals can result in saturated color emission. This can lead to efficient nanocrystal-light emitting devices even in the red and blue parts of the visible spectrum, since in nanocrystal emitting devices no photons are lost to infrared and UV emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of nanocrystals will emit light spanning a narrow range of wavelengths. A device including more than one size of nanocrystal can emit light in more than one narrow range of wavelengths. The color of emitted light perceived by a viewer can be controlled by selecting appropriate combinations of nanocrystal sizes and materials in the device. Furthermore, environmental stability of covalently bonded inorganic nanocrystals suggests that device lifetimes of hybrid organic/inorganic light emitting devices should match or exceed that of all-organic light emitting devices, when nanocrystals are used as luminescent centers. The degeneracy of the band edge energy levels of nanocrystals facilitates capture and radiative recombination of all possible excitons, whether generated by direct charge injection or energy transfer. The maximum theoretical nanocrystal-light emitting device efficiencies are therefore comparable to the unity efficiency of phosphorescent organic light emitting devices. The excited state lifetime ($\tau$) of the nanocrystal is much shorter ($\tau \sim 10$ ns) than a typical phosphor ($\tau > 0.5$ µs), enabling nanocrystal-light emitting devices to operate efficiently even at high current density.

Devices can be prepared that emit visible or infrared light. The size and material of a semiconductor nanocrystal can be selected such that the nanocrystal emits visible or infrared light of a selected wavelength. The wavelength can be between 300 nm and 2,500 nm or greater, for instance between 300 nm and 400 nm, between 400 nm and 700 nm, between 700 nm and 1100 nm, between 1100 nm and 2500 nm, or greater than 2500 nm.

Individual devices can be formed at multiple locations on a single substrate to form a display. The display can include devices that emit at different wavelengths. By patterning the substrate with arrays of different color-emitting semiconductor nanocrystals, a display including pixels of different colors can be formed. In some applications, the substrate can include a backplane. The backplane includes active or passive electronics for controlling or switching power to individual pixels. Include a backplane can be useful for applications such as displays, sensors, or imagers. In particular, the backplane can be configured as an active matrix, passive matrix, fixed format, directly drive, or hybrid. The display can be configured for still images, moving images, or lighting. A lighting display can provide white light, monochrome light, or color-tunable light.

Figure 4:
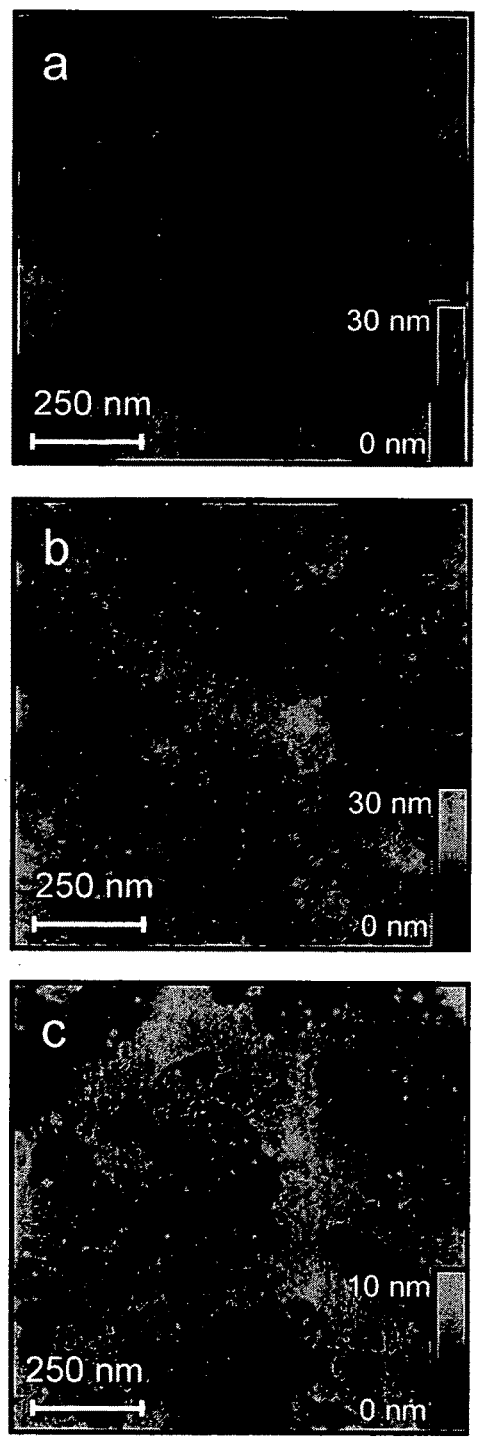
FIGS. 4A-4C are atomic force microscope images of surfaces.

FIG. 4 demonstrates the surface relief that observed at each step of the microcontact printing process measured by atomic force microscopy (AFM). FIG. 4A shows the flatness of the PDMS stamp itself when it was cast onto a planar (non-patterned) master. FIGS. 4B and 4C show the stamp inked with semiconductor nanocrystals, and the transferred semiconductor nanocrystals on the organic semiconductor hole transporting layer, respectively. The semiconductor nanocrystals formed a sub-monolayer (i.e., a monolayer that does not cover all of the available area) that covered 30-40% of the surface area in FIG. 4C. In FIGS. 4B and 4C, islands of semiconductor nanocrystals which make up the sub-monolayer were visible, though the individual semiconductor nanocrystals were observable only when they are found isolated from other semiconductor nanocrystals. The total peak-to-peak height observed in FIGS. 4B and 4C was less than 10 nm, indicating that the deposition was indeed only one monolayer thick (the semiconductor nanocrystals used in this experiment were 6-8 nm in diameter). Monolayers with film area coverages of greater than 90% were achieved by increasing the concentration of semiconductor nanocrystals in the original chloroform solution that was used to ink the stamp.

The microcontact printing of semiconductor nanocrystals, in contrast, was a dry process (i.e., does not require solvent) that did not introduce impurities into the device fabrication. All of the organic layers in the device were deposited under ultra-high vacuum conditions. The organic layers were exposed only once to a nitrogen environment for the deposition of the semiconductor nanocrystal layers. None of the organic semiconductor materials were exposed to solvent at any step of the device fabrication. The semiconductor nanocrystal deposition was followed by the successive deposition of a hole blocking layer (HBL) 3-(4-biphenylyl)-4-phenyl-5-tert-butylphenyl-1,2,4-triazole (TAZ) and the ETL, tris-(8 hydroxyquinoline)aluminum (Alq$_3$), and finally an evaporated Mg:Ag/Ag cathode (50:1 Mg:Ag by weight).

FIG. 5 shows the device characteristics for red, green, and blue light emitting devices fabricated using the semiconductor nanocrystal microcontact printing technique. Red, green, and blue emitting semiconductor nanocrystals were all printed separately onto a thermally evaporated thin film of hole transport material 4-4'-N,N'-dicarbazolyl-biphenyl (CBP).

Figure 5A:
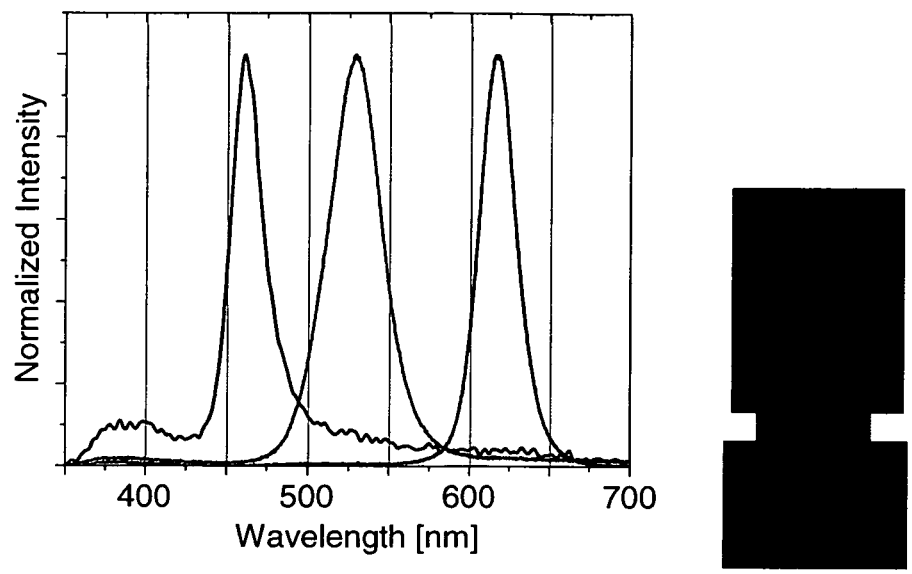
FIGS. 5A-5D are graphs depicting the performance of light-emitting devices.
Figure 5B:
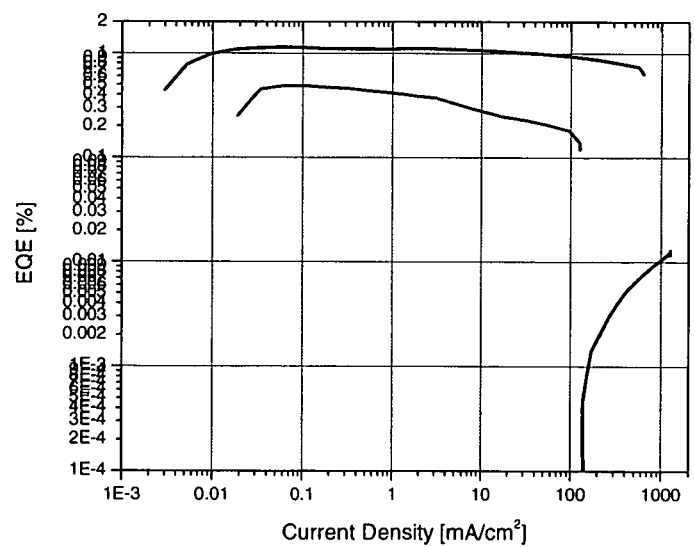
Figure 5C:
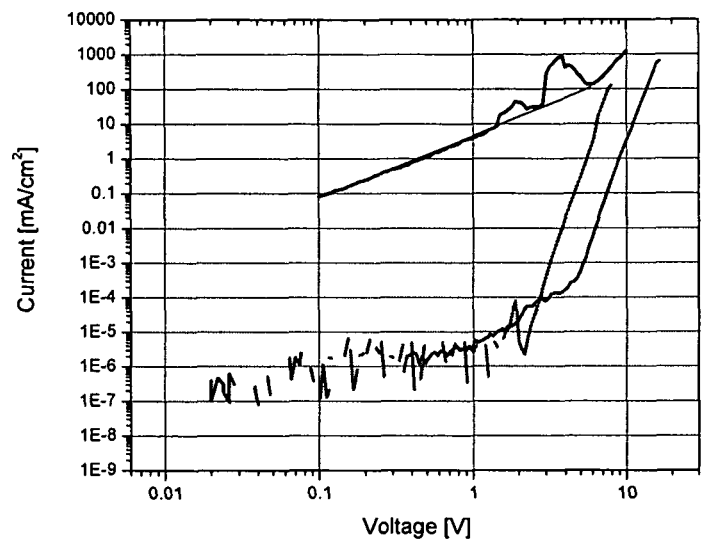
Figure 5D:
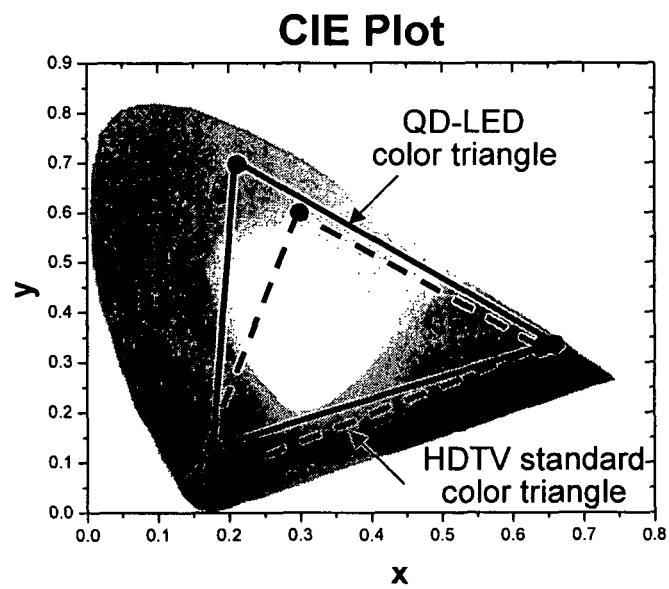

FIGS. 5A-5D presents device characteristics of red, green, and blue emitting light emitting devices. The electroluminescence (EL) spectra of red-, green-, and blue-emitting devices are shown in FIG. 5A along with digital photos taken of individual red, green, and blue devices. The external quantum efficiency and current-voltage curves are presented in FIGS. 5B and 5C, respectively. The colors of the lines in each plot correspond to the color of light that the device is emitting. FIG. 5D shows where those colors being emitted by the respective devices fall on the CIE Chromaticity Diagram relative to the HDTV standard color triangle.

Previous work on semiconductor nanocrystal employed N,N'-diphenyl-N,N'-bis(3-methylphenyl)-(1,1'-biphenyl)-4,4'-diamine (TPD) as the HTL, due to its good solubility in chloroform and chlorobenzene (which are solvent compatible with the semiconductor nanocrystals) compared to many other HTL candidates. The microcontact printing method does not require that the HTL/HIL material be solvent compatible with the semiconductor nanocrystal. Therefore, other HTL/HIL materials were explored, and the wide band gap organic semiconductor CBP was employed. The larger band gap CBP molecule produced far better color saturation in the devices as can be seen in FIGS. 5A and 5D. Color saturation refers to how pure a color appears to the human eye and is quantified in the Commission International d'Eclairage (CIE) chromaticity coordinates, calculated from the emission wavelength and bandwidth (full width at half maximum), which in turn can then be plotted on the CIE diagram as shown in FIG. 5D.

The greater color saturation can be attributed to the larger downhill energy transfer process now available with the use of CBP, which results in decreased intensity of organic emission and increased intensity of semiconductor nanocrystal emission, leading in turn to a larger ratio between the semiconductor nanocrystal EL to organic EL.

The superior color saturation of the red and green semiconductor nanocrystal devices was represented by their position on the CIE diagram relative to the current High Definition Television (HDTV) standard color triangle as seen in FIG. 5D. The CIE color coordinates of the blue device lie just inside the HDTV standard color triangle and was a result of the red tail seen in the EL spectrum of the blue device (FIG. 5A). This red tail can be the result of exiplex emission—in other words, a mixed state between the two large band gap HTL and HBL in our device structure. This exiplex emission was not seen in the red device, possibly because those energy states from the exiplex are Förster energy-transferred to the red-emitting semiconductor nanocrystals. The green device exhibited only a very small amount of this exiplex emission, probably due to the high degree of film coverage of the monolayer of green emitting semiconductor nanocrystals, which separates the HTL from the HBL and therefore their interaction, as well as the high PL quantum efficiency (40%) of the nanocrystals themselves, which contributes to the large nanocrystal EL intensity relative to the organic exiplex EL. Another contributing factor is that when the devices are run at high currents (~100 µA) the exiplex emission peak shifts from ~620 nm to ~520 nm, which is right over the green nanocrystal emission peak and is either covered completely by the green nanocrystal emission or is Förster energy transferred to the green emitting nanocrystals. The blue devices will improve as the blue emitting semiconductor nanocrystal PL quantum efficiency increases (currently 20%). FIG. 5B shows the external quantum efficiency (EQE) of the red, green, and blue semiconductor nanocrystal devices and demonstrates how the EQE of the devices scales with the PL quantum efficiency of the semiconductor nanocrystals. Currently the EQE of the red-emitting device was 1.2% using semiconductor nanocrystals having PL quantum efficiencies of 70% after processing and preparing for device use. The green-emitting nanocrystal devices had EQEs of 0.5% using semiconductor nanocrystals with PL quantum efficiencies of 40%. The blue EQE was 0.25% using semiconductor nanocrystals with PL quantum efficiencies of 20%. All three colors of nanocrystal devices had reproducible, stable current-voltage (IV) characteristics as seen in FIG. 5C, with turn on voltages of 2-5 V and operating voltages of 8-12 V. Display brightness (100 cd/m$^2$) was achieved at ~2 mA/cm$^2$ and ~10 V for all three colors of nanocrystal light emitting devices.

Figure 6:
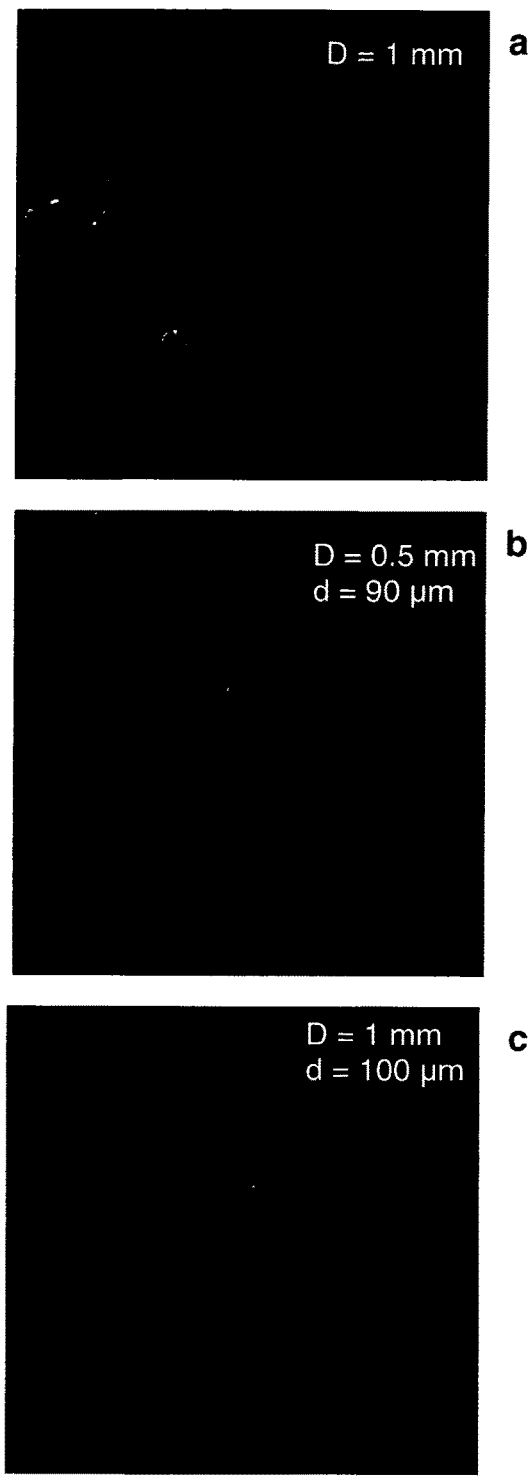
FIGS. 6A-6C are photographs of light-emitting devices.

The semiconductor nanocrystal microcontact printing technique provides the ability to place different color emitting semiconductor nanocrystals on the same substrate in a pattern, leading towards formation of pixels for full color display applications. Pixel dimensions for full color displays are typically on the order of 20-30 µm. Patterned semiconductor nanocrystal light emitting devices can be formed on a scale of less than 100 µm. FIG. 6A shows the result of stamping an area of green-emitting semiconductor nanocrystals next to an area of red-emitting semiconductor nanocrystals on the same 1 inch substrate. The three devices that have been turned on in FIG. 6A were adjacent red- and green-emitting devices as well as a device on an area where no semiconductor nanocrystals were stamped (i.e, an organic LED with the structure: ITO/CBP/TAZ/Alq$_3$/Mg:Ag/Ag).

FIG. 6B demonstrates the real potential of this technique to achieve sub-100 µm patterning toward pixelation for nanocrystal light emitting displays. To make the device shown in FIG. 6B, green-emitting semiconductor nanocrystals were stamped over the entire area. Subsequently, red-emitting semiconductor nanocrystals were stamped down then on top of the green-emitting nanocrystals using a stamp that was patterned with posts. The posts were 5 µm in height and 90 µm in diameters. The device that has been turned on is 0.5 mm in diameter, and the red circles visible within this device are the sub-100 µm patterned red-emitting semiconductor nanocrystals. Microcontact printing can be used to pattern submicron features (see, e.g., U.S. Pat. Nos. 5,512,131; 6,180,239; and 6,518,168, each of which is incorporated by reference in its entirety). FIG. 6C shows patterned lines of semiconductor nanocrystal monolayers. Such a technique can be employed in the fabrication of full color active matrix nanocrystal light emitting device displays. The stamp was patterned with lines 1 µm high and 100 µm in width. The result of stamping green-emitting nanocrystals using this patterned stamp and turning on an area of 1 mm by defining the device through the size of the cathode (Mg:Ag/Ag), was emission of the green nanocrystals, visible as lines of 100 µm wide, interspersed with the blue organic EL as a result of the absence of nanocrystals in the area between stamped lines.

Figure 7A:
FIGS. 7A-7H illustrate properties of light emitting devices.
Figure 7B:
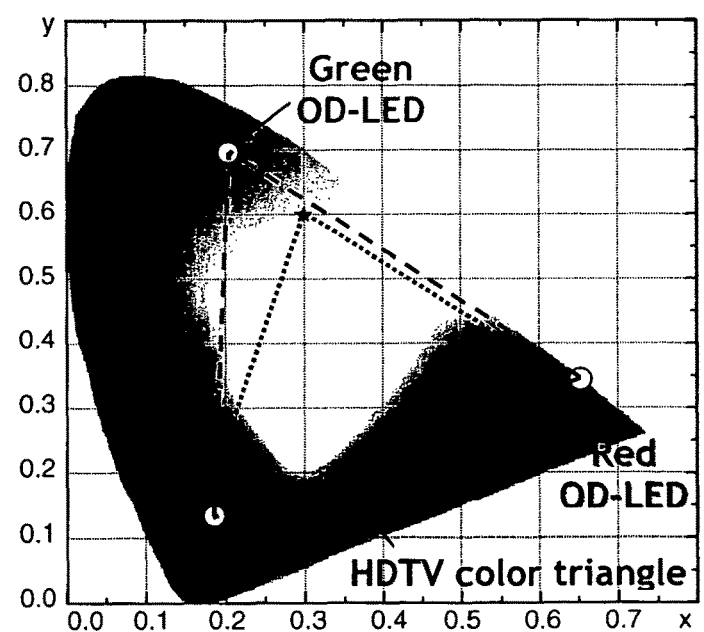
Figure 7C:
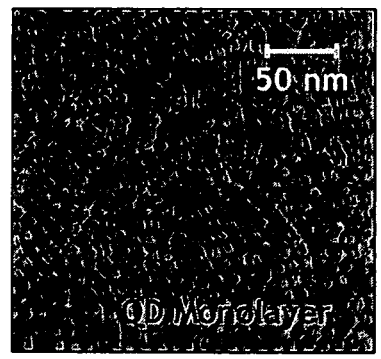
Figure 7D:
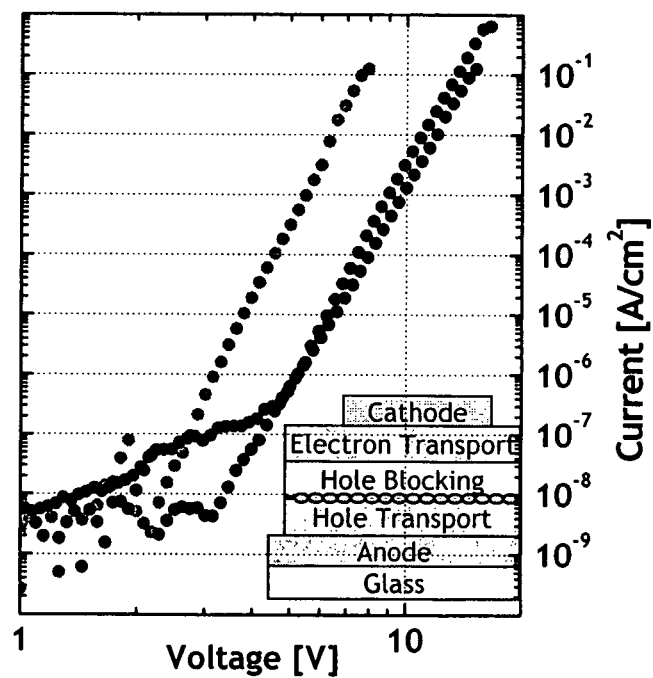
Figure 7E:
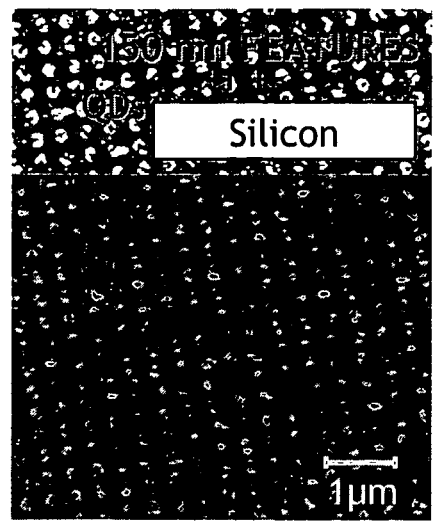
Figure 7F:
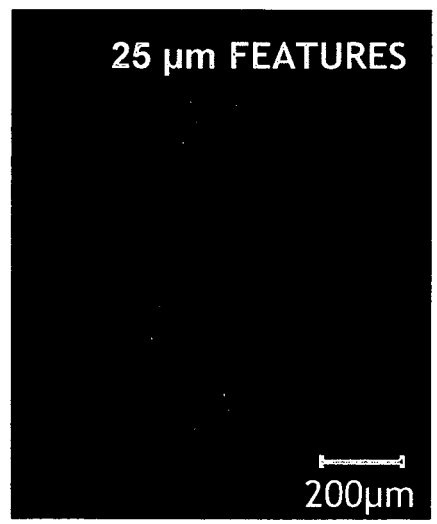
Figure 7G:
Figure 7H:
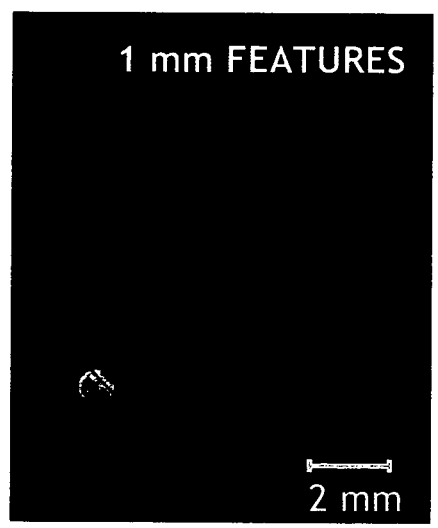

The printed nanocrystal monolayers generated electroluminescence in the red, green, and blue devices pictured in FIG. 7A, which all have the same layered thin film structure: ITO/CBP (40 nm thick layer)/nanocrystal monolayer/TAZ (15 nm)/Alq$_3$ (25 nm)/Mg:Ag/Ag (see FIG. 7D inset). FIG. 7C is an AFM image of a nanocrystal monolayer after it has been stamped onto the organic hole transporting layer. The only difference between the devices pictured in FIG. 7A is the luminescence color of the nanocrystal monolayer, determined by the size and composition of the nanocrystals. All the organic and metal films were thermally evaporated at 10$^{-6}$ Torr. FIGS. 7F and 7G show that 25 µm (1000 dpi) patterning of LED pixels was achieved, as were 150 nm wide nanocrystal monolayer patterns (FIG. 7E). In FIG. 7G, 25 µm wide intersecting stripes of red and green nanocrystal monolayers were stamped over each other in the LED structure in which TPD (40 nm thick) replaced CBP. FIG. 7H is a photograph of operating nanocrystal LEDs demonstrating multicolor area patterning with micro-contact printing. Two adjacent areas on the same substrate were stamped with a monolayer of red and green emitting nanocrystals. Three different devices were turned on; a device made over an area where red emitting nanocrystals had been stamped, a device over an area where green emitting nanocrystals had been stamped, and a device over an area where no nanocrystals had been stamped (blue luminescence). Electroluminescence of red and green nanocrystals and blue TPD was simultaneously observed when the LED was biased at 5 V.

The solvent-free deposition of the nanocrystal monolayers enabled use of the thermally evaporated organic semiconductor, CBP, as a hole transport layer. The wide band gap of CBP contributed to more efficient charge confinement and an improvement in color saturation of the LEDs, yielding CIE coordinates (0.18, 0.13), (0.21, 0.70), and (0.66, 0.34) for the blue, green, and red LED, respectively, and with corresponding external quantum efficiencies of 0.2%, 0.5%, and 1.0% at video brightness (FIG. 7B). Current/voltage data for the three different colors are presented in FIG. 7D. The wide range of colors produced by nanocrystal-LEDs exceeded the performance of both liquid crystal display (LCD) and organic LED (OLED) technologies, suggesting the suitability of nanocrystal based LEDs in high definition, accurate color flat panel displays and in general light sources.

Red-, green-, and blue-emitting semiconductor nanocrystal-based light emitting devices are efficient, highly color saturated compared to organic LEDs and liquid crystal displays, and can be patterned towards pixelation for full color display applications by means of microcontact printing of single layers of nanocrystals.

Other embodiments are within the scope of the following claims.

What is claimed is:

1. A method of forming a light emitting device comprising:
   modifying a surface of an applicator, wherein modifying the surface of the applicator includes contacting the surface of the applicator with a composition selected to release at least a portion of the plurality of semiconductor nanocrystals from the applicator upon contact with a substrate; wherein the plurality of semiconductor nanocrystals have no more than a 5% rms deviation from mean diameter, wherein the surface of the applicator includes a pattern,
   placing an solvent-free ink including a plurality of semiconductor nanocrystals on the modified surface of the applicator, wherein the plurality of semiconductor nanocrystals forms a monolayer;
   contacting the modified surface of the applicator including a solvent-free ink to a substrate including a first electrode, thereby dry-transferring at least a portion of the plurality of semiconductor nanocrystals to the substrate wherein the plurality of semiconductor nanocrystals form a partial monolayer on the substrate;

arranging a second electrode opposed to the first electrode, and the plurality of semiconductor nanocrystals are disposed between the first electrode and the second electrode by contact printing;

placing a second solvent-free ink including a plurality of semiconductor nanocrystals on a surface of a second applicator; and contacting the surface of the second applicator including a solvent-free second ink to the substrate, thereby dry-transferring at least a portion of the plurality of semiconductor nanocrystals to the substrate wherein the plurality of semiconductor nanocrystals form a partial monolayer on the substrate, wherein the first plurality of semiconductor nanocrystals have an emission wavelength distinguishable from the second plurality of semiconductor nanocrystals and the first and second pluralities of semiconductor nanocrystals are applied in non-overlapping predefined regions of the substrate and producing a color saturation attributed to a decreased intensity of organic emission and increased intensity of semiconductor nanocrystal emission, leading to a larger ratio between semiconductor nanocrystal electroluminescence to organic electroluminescence.

2. The method of claim 1, wherein the pattern includes an elevation or a depression.

3. The method of claim 1, wherein the plurality of semiconductor nanocrystals forms a pattern on the substrate.

4. The method of claim 1, wherein the composition includes an aromatic organic polymer.

5. The method of claim 1, further comprising placing a third plurality of semiconductor nanocrystals on a surface of a third applicator; and contacting the surface of the third applicator to the substrate, thereby transferring at least a portion of the third plurality of semiconductor nanocrystals to the substrate.

6. The method of claim 1, wherein the substrate includes a layer including a hole transport material over the first electrode.

7. The method of claim 1, wherein placing the plurality of semiconductor nanocrystals on the modified surface of the applicator includes spin coating, blade coating, slot coating, dip coating, spray coating, rod coating, reverse roll coating, forward roll coating, air knife coating, knife over roll coating, gravure, microgravure, extrusion coating, slide coating, curtain coating, or a combination thereof.

8. The method of claim 1, wherein the modified surface of the applicator is substantially free of elevations and depressions.

9. The method of claim 2, wherein a feature of the pattern has a dimension of less than 10 millimeters.

10. The method of claim 2, wherein a feature of the pattern has a dimension of less than 1 millimeter.

11. The method of claim 2, wherein a feature of the pattern has a dimension of less than 100 micrometers.

12. The method of claim 2, wherein a feature of the pattern has a dimension of less than 1 micrometer.

13. The method of claim 2, wherein a feature of the pattern has a dimension of at least 1 centimeter.

14. The method of claim 2, wherein a feature of the pattern has a dimension of at least 10 centimeters.

15. The method of claim 2, wherein a feature of the pattern has a dimension of at least 100 centimeters.

16. The method of claim 5, wherein the third plurality of semiconductor nanocrystals have an emission wavelength distinguishable from the first plurality of semiconductor nanocrystals, and distinguishable from the second plurality of semiconductor nanocrystals.

17. The method of claim 16, wherein the first, second and third pluralities of semiconductor nanocrystals are applied in non-overlapping predefined regions of the substrate.

18. The method of claim 17, wherein the emission wavelengths of the first, second and third pluralities of semiconductor nanocrystals are selected from an ultraviolet, blue, green, yellow, red, or infrared emission wavelength, or a combination thereof.

19. The method of claim 6, further comprising forming a layer including an electron transporting material over the plurality of semiconductor nanocrystals.

20. The method of claim 19, wherein the second electrode is applied over the layer including the electron transporting material.

21. The method of claim 8, wherein the applicator is mounted on a rotatable drum, wherein placing the plurality of semiconductor nanocrystals on the surface of the applicator includes intermittent application of the plurality of semiconductor nanocrystals.

* * * * *